(12) United States Patent
Sakita

(10) Patent No.: US 8,824,164 B2
(45) Date of Patent: Sep. 2, 2014

(54) LAMINATE PRINTED BOARD AND MANUFACTURING METHOD THEREOF

(75) Inventor: Tsuyoshi Sakita, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 122 days.

(21) Appl. No.: 13/550,883

(22) Filed: Jul. 17, 2012

(65) Prior Publication Data

US 2013/0050971 A1 Feb. 28, 2013

(30) Foreign Application Priority Data

Aug. 29, 2011 (JP) ................... 2011-185598

(51) Int. Cl.
*H05K 1/14* (2006.01)
*H05K 3/36* (2006.01)

(52) U.S. Cl.
USPC ............... 361/803; 361/748; 29/832; 29/739; 174/250; 439/76.2

(58) Field of Classification Search
USPC ......... 361/803, 807, 809, 819, 823, 802, 791, 361/748; 439/76.2; 174/250; 29/739, 832
See application file for complete search history.

(56) References Cited

U.S. PATENT DOCUMENTS

| 8,310,085 | B2 * | 11/2012 | Sugimura et al. | 307/10.1 |
| 2004/0253851 | A1 * | 12/2004 | Naitou et al. | 439/76.2 |
| 2005/0257950 | A1 * | 11/2005 | Yamashita et al. | 174/50 |
| 2009/0020332 | A1 * | 1/2009 | Sano | 174/88 R |
| 2011/0229377 | A1 * | 9/2011 | Dong et al. | 422/186.04 |

FOREIGN PATENT DOCUMENTS

JP  2009-26464  2/2009

* cited by examiner

*Primary Examiner* — Robert J Hoffberg
*Assistant Examiner* — Michael Matey
(74) *Attorney, Agent, or Firm* — Greenblum & Bernstein, P.L.C.

(57) ABSTRACT

The present invention provides a laminate printed board having a novel structure that is able to ensure alignment accuracy of the interboard terminals soldered to one printed board and that is also able to achieve a simplification of the process of soldering the interboard terminals. Through-hole lines in which a plurality of through-holes extend in lines are formed on a first printed board. Additionally, a press-fitting fastener hole is formed within the through-hole lines and a first end of an interboard terminal is press-fitted and fastened to the press-fitting fastener hole. Additionally, first ends of others of the interboard terminals are inserted through and flow soldered to through-holes on the first printed board.

9 Claims, 6 Drawing Sheets

LAMINATE PRINTED BOARD AND MANUFACTURING METHOD THEREOF

CROSS-REFERENCE TO RELATED APPLICATIONS

The present application claims priority under 35 U.S.C. §119 of Japanese Application No. 2011-185598, filed on Aug. 29, 2011, the disclosure of which is expressly incorporated by reference herein in its entirety.

BACKGROUND OF THE INVENTION

1. Field of the Invention

The present invention relates to a laminate printed board in which two printed boards are laminated and connected by a plurality of interboard terminals, and a manufacturing method thereof 2. Description of Related Art Conventionally, a laminate printed board in which two printed boards are laminated and mutually connected by a plurality of interboard terminals, such as that described in Japanese Patent Laid-open Publication No. 2009-26464 (Related Art 1), for example, has been used as an internal circuit in an electrical connection box, such as a junction box mounted in an automobile.

In this type of laminate printed board, first ends of a plurality of interboard terminals are inserted through and soldered to one set of respective through-holes on a first printed board. Also, second ends are inserted through and soldered to another set of respective through-holes on a second printed board. Thus, should the plurality of interboard terminals not be accurately positioned at the stage of soldering to the first printed board, there is a risk that insertion through the through-holes of the second printed board will become difficult.

Supporting the plurality of interboard terminals with a synthetic resin base has been suggested in the laminate printed board described in Related Art 1. However, such a configuration leads to an increase in the number of components due to the necessity of a base as a separate component. In addition, there is a risk that the base may thermally expand from heat of soldering or the like, pulling on the interboard terminals and producing positional drift. Good alignment accuracy thus cannot necessarily be ensured and cracks may occur in the soldering portions of the interboard terminals.

In addition, soldering the interboard terminals to the two printed boards requires the first ends of the interboard terminals first be in a state inserted through the through-holes of the first printed board, immersing the bottom surface of the printed board in a soldering pot to be flow soldered, then inserting the second ends through the through-holes of the second printed board to form an assembly, and inverting the assembly to immerse in the soldering pot the bottom surface of the second printed board, on which the second ends project, to be flow soldered once more. The process had been cumbersome and required time and effort. In particular, in a case where the electronic components mounted on the printed board are of a surface-mounted type only, a flow soldering process must be performed to solder only the interboard terminals, separate from the reflow soldering process for the surface-mounted components, and there is a risk that this may lead to a decrease in manufacturing efficiency.

SUMMARY OF THE INVENTION

The present invention was provided with the above-described situation as background. In order to address the problem, a laminate printed board having a novel structure is provided that is able to ensure alignment accuracy of the interboard terminals soldered to one printed board without leading to an increase in the number of components, and that is also able to achieve a simplification of the process of soldering the interboard terminals. In addition, a novel manufacturing method for the laminate printed board is provided which can be favorably used to manufacture such a laminate printed board.

One aspect of the laminate printed board is a laminate printed board in which a first printed board and a second printed board are spaced apart. In addition, the first printed board and the second printed board are mutually connected by a plurality of interboard terminals, both ends of which are inserted through and soldered to a plurality of through-holes provided thereon. The plurality of through-holes are formed in a line on the first printed board, and within the line of through-holes, at least one press-fitting fastener hole is formed passing through the first printed board. Of the plurality of interboard terminals, a first end of one of the interboard terminals is press-fitted and fastened to the press-fitting fastener hole and, in addition, the first ends of the other interboard terminals are inserted through and reflow soldered to the through-holes on the first printed board, while second ends of the plurality of interboard terminals are inserted through and flow soldered to the through-holes on the second printed board.

According to the laminate printed board having a configuration according to the present aspect, a press-fitting fastener hole to which the interboard terminal is able to press-fit and fasten is provided within the through-hole line on the first printed board. Accordingly, the plurality of interboard terminals are prepared as a chain terminal connected in parallel with a belt-like carrier and, by press-fitting and fastening one of the interboard terminals in the chain terminal to the press-fitting fastener hole, the other interboard terminals connected by the carrier can be held in a state inserted through the through-holes on the first printed board. As a result, the plurality of interboard terminals are fixed in position with respect to the first printed board and can be soldered with reflow soldering without requiring a special component such as a base. In particular, in a case where surface-mounted components are reflow soldered to the first printed board, the interboard terminals can be soldered simultaneously with the reflow soldering process of the surface-mounted components. Accordingly, soldering of the interboard terminals can be performed with a simple process, without requiring cumbersome effort such as, similar to convention, following a reflow soldering process for the surface-mounted components, the first ends of the interboard terminals are flow soldered to the first printed board, then the second ends are inserted through the through-holes of the second printed board and the resulting assembly is inverted, the bottom surface of the second printed board then being immersed again in the soldering pot. In addition, because a base supporting the interboard terminals is rendered unnecessary, no increase in the number of parts is involved, either. Moreover, risks can be reduced such as the work of inserting the interboard terminals into the through-holes on the second printed board becoming difficult when the alignment accuracy of the interboard terminals degrades due to thermal expansion of the base, or soldering cracks developing, and better manufacturing quality can be obtained.

One press-fitting fastener hole may be formed in the through-hole line, and a plurality may also be formed. Moreover, the formation location of the press-fitting fastener hole in the through-hole line is not particularly limited. One press-fitting fastener hole may, for example, be formed in a central portion of the through-hole line, two press-fitting fastener holes may be formed at both end portions of the through-hole line, or the like.

Another aspect of the laminate printed board is the press-fitting fastener hole in which a land is formed on a circumferential edge of an opening, on a side where the second ends of the interboard terminals project, and in which the interboard terminal press-fitted into the press-fitting fastener hole is reflow soldered to the land.

According to the present aspect, by forming the land on the press-fitting fastener hole, the interboard terminal press-fitted and fastened to the press-fitting fastener hole can be reflow soldered along with the other interboard terminals and can be affixed by soldering to the first printed board. Accordingly, the interboard terminal press-fitted into the press-fitting fastener hole can be fastened more strongly thereto. As a result, the other interboard terminals can be held in position more securely with respect to the first printed board and, in addition, the risk can be reduced that manufacturing apparatuses and other components may be negatively affected by the interboard terminal press-fitted in the press-fitting fastener hole slipping free.

Another aspect of the laminate printed board is the press-fitting fastener hole formed in the central portion of the through-hole line on the first printed board.

According to the present aspect, when the chain terminal, in which the plurality of interboard terminals are connected in parallel by the belt-like carrier, is inserted through the through-holes on the first printed board, for example, the interboard terminal positioned in the central portion of the plurality of parallel interboard terminals can be press-fitted and fastened to the press-fitting fastener hole. Thereby, the plurality of interboard terminals connected by the belt-like carrier can be held with good balance by the interboard terminal positioned in the central portion.

Another aspect of the laminate printed board is the press-fitting fastener hole as one of the plurality of through-holes which are electrically connected to printed wirings on the first printed board.

According to the present aspect, the press-fitting fastener hole can be effectively used as a through-hole configuring an electrical circuit on the first printed board. As a result, space on the first printed board can be employed more effectively and, in addition, the interboard terminal press-fitted and fastened to the press-fitting fastener hole can also be employed more effectively as a conductive path electrically connecting the first printed board and the second printed board.

An embodiment relating to a manufacturing method of the laminate printed board is a manufacturing method for a laminate printed board in which a first printed board and a second printed board are spaced apart and, in addition, the first printed board and the second printed board are mutually connected by a plurality of interboard terminals, both ends of which are inserted through and soldered to a plurality of through-holes provided thereon. The manufacturing method of the laminate printed board is a process of forming a plurality of through-holes in a line on the first printed board; a process of forming at least one press-fitting fastener hole passing through the first printed board within the line of through-holes; a process of preparing a chain terminal in which the plurality of interboard terminals are separably connected in parallel by a belt-like carrier; a process in which a first end of one interboard terminal in the chain terminal is press-fitted and fastened to the press-fitting fastener hole and, in addition, the first ends of the other interboard terminals connected by the carrier are inserted through and reflow soldered to the through-holes on the first printed board; and a process in which second ends of the plurality of interboard terminals in the chain terminal are inserted through and flow soldered to the through-holes on the second printed board.

In the manufacturing method according to the present embodiment, the plurality of interboard terminals connected by the belt-like carrier are inserted through the through-holes on the first printed board and, in addition, at least one of the interboard terminals is press-fitted and fastened to the press-fitting fastener hole formed on the first printed board. Thereby, the plurality of interboard terminals prior to soldering can maintain position in a state inserted through the through-holes on the first printed board without requiring a special component such as a base. As a result, an increase in the number of components can be avoided to achieve a reduction in manufacturing costs and, in addition, a decrease in alignment accuracy and an occurrence of cracks in solder due to positional drift of the interboard terminals caused by thermal expansion of the base can be inhibited. An improvement in manufacturing quality can thus be achieved.

Also, the first ends of the interboard terminals are inserted through and reflow soldered to the through-holes on the first printed board. Therefore, the time and effort to flow solder the first ends of the interboard terminals to the first printed board, then invert the assembly of the second printed board on the second ends of the interboard terminals and immerse the bottom surface of the second printed board once more in a soldering pot to perform flow soldering, as in a case where both end portions of the interboard terminals are flow-soldered, is not necessary and the soldering process can be simplified. In particular, in a case where surface-mounted components are reflow soldered to the first printed board, the interboard terminals can be reflow soldered to the through-holes on the first printed board in the same process as a reflow soldering process for the surface-mounted components, and better manufacturing efficiency can be obtained.

In the present embodiment relating to the laminate printed board, the press-fitting fastener hole is formed within the line of through-holes on the first printed board and the first end of the interboard terminal is press-fitted and fastened to the press-fitting fastener hole. In addition, the first ends of the other interboard terminals are inserted through and reflow soldered to the through-holes on the first printed board, while the second ends of the interboard terminals are inserted through and flow soldered to the through-holes on the second printed board. Thereby, one interboard terminal of the chain terminal, in which the plurality of interboard terminals are connected in parallel by the belt-like carrier, is press-fitted and fastened to the press-fitting fastener hole. Accordingly, prior to soldering, the other interboard terminals can maintain position via the carrier in a state inserted through the through-holes of the first printed board. As a result, alignment accuracy of the plurality of interboard terminals soldered to the first printed board can be ensured and insertion through the through-holes of the second printed board can be performed more easily and reliably, without requiring a special component such as a base. In addition, the first ends of the interboard terminals are reflow soldered to the through-holes on the first printed board, and thus the soldering process can be further simplified, as compared to a case where both end portions are flow soldered.

In the present embodiment relating to the manufacturing method of the laminate printed board, the press-fitting fastener hole is formed within the line of through-holes on the first printed board, and one of the interboard terminals in the chain terminal, in which the plurality of interboard terminals are connected by the belt-like carrier, is press-fitted and fastened to the press-fitting fastener hole. Thereby, the interboard terminal fastened to the press-fitting fastener hole and the plurality of interboard terminals connected via the carrier can maintain position and be soldered in a state inserted through the through-holes on the first printed board without using a special component such as a base. Accordingly, an improvement in manufacturing costs can be achieved through a reduction in the number of components. In addition, positional drift of the interboard terminals caused by expansion of the base or the like can be avoided, and thus the alignment accuracy of the interboard terminals can be ensured with better accuracy and the work of insertion through the through-holes on the second printed board can be performed more easily. Further, the first ends of the interboard terminals are reflow soldered, and thus the soldering process can be further condensed, as compared to the case where both end portions are flow soldered.

BRIEF DESCRIPTION OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein.

DETAILED DESCRIPTION OF THE INVENTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description is taken with the drawings making apparent to those skilled in the art how the forms of the present invention may be embodied in practice.

Hereafter, an embodiment of the present invention is described with reference to the figures.

Figure 1:
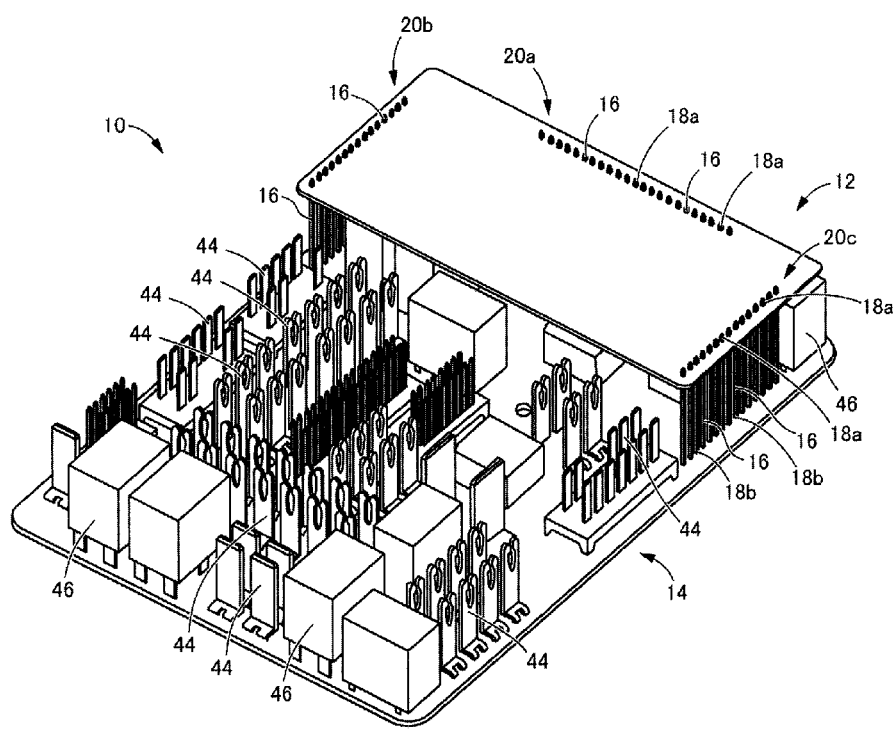
FIG. 1 is a perspective view of a laminate printed board for an embodiment of the present invention.

First, FIG. 1 illustrates a laminate printed board 10 for the embodiment of the present invention. The laminate printed board 10 is accommodated within a case of an electrical connection box not shown in the drawings, and configures an internal circuit of the electrical connection box. The laminate printed board 10 is configured by a first printed board 12 and a second printed board 14 being disposed in a laminate state opposing each other, spaced apart, and mutually connected by a plurality of interboard terminals 16.

Figure 2:
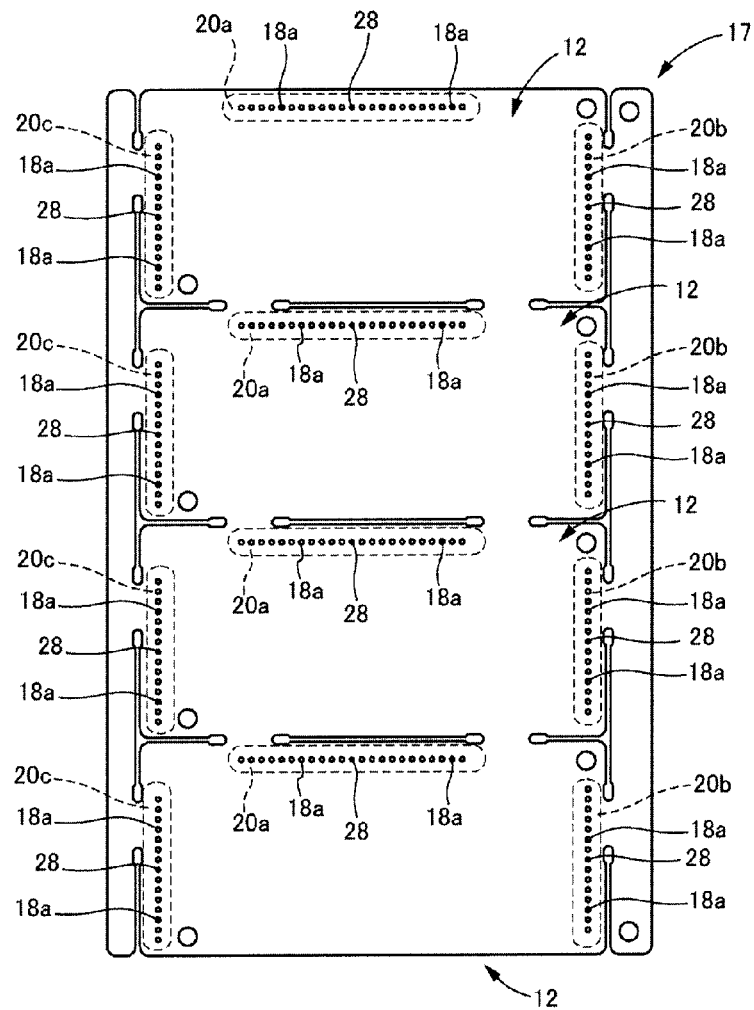
FIG. 2 is a plan view of a first printed board.

FIG. 2 illustrates the first printed board 12. The first printed board 12 according to the present embodiment is produced by forming a plurality (four in FIG. 2) of first printed boards 12 in a connected state on one board 17 and cutting out each one. The first printed board 12 has a substantially longitudinal rectangular shape. In an outer peripheral portion of the first printed board 12, on one long side portion and a pair of short side portions, through-hole lines 20a, 20b, and 20c are respectively formed, in which a plurality of through-holes 18a are formed in lines along the outer peripheral edges of the first printed board 12. Each of the through-hole lines 20a, 20b, and 20c has a substantially similar configuration to one another, and thus the through-hole line 20a will be described below as an example.

Figure 3:
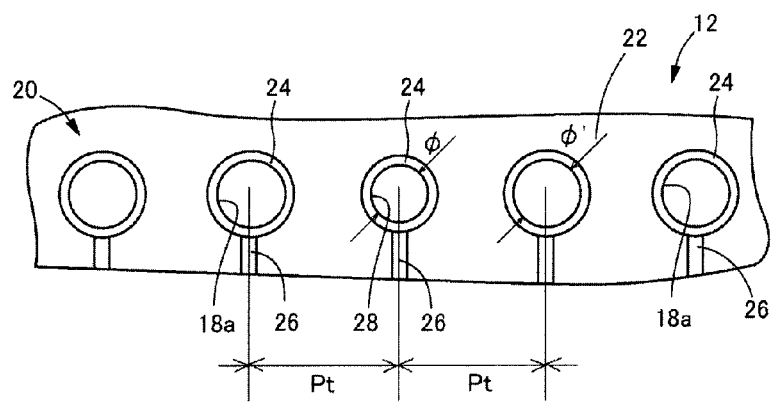
FIG. 3 is an expanded view of a main portion of FIG. 2.

In the through-hole line 20a, a plurality of through-holes 18a are formed in one line. As shown in FIG. 3, the through-holes 18a, as conventionally known, are formed of a circular through-hole passing through the first printed board 12. At the through-holes 18a, a land 24 is formed on a circumferential edge of an opening on a surface 22 on the first printed board 12 facing the second printed board 14 and, in addition, an inner peripheral surface is plated. Also, each of the through-holes 18a is connected to a printed wiring 26 formed on the first printed board 12.

Further, on the first printed board 12, one press-fitting fastener hole 28 is formed at a central portion in each of the through-hole lines 20a, 20b, and 20c. The press-fitting fastener hole 28 has a circular through-hole shape passing through the first printed board 12. The inner diameter measurement $\phi$ of the press-fitting fastener hole 28 is made smaller compared to the inner diameter measurement $\phi'$ of the through-holes 18a, and the press-fitting fastener hole 28 is set to a size so that the interboard terminal 16 inserted therethrough is press-fitted to contact the inner circumferential surface of the press-fitting fastener hole 28.

The press-fitting fastener hole 28 in the present embodiment in particular, similar to the rest of the plurality of through-holes 18a formed in the through-hole line 20a, is formed of a through-hole electrically connecting the second printed board 14 with the first printed board 12 via the interboard terminal 16. Therefore, in the press-fitting fastener hole 28, the land 24 is formed on the circumferential edge of the opening on the surface 22. In addition, the inner peripheral surface is plated, and the press-fitting fastener hole 28 is connected to the printed wiring 26 formed on the first printed board 12.

Moreover, the inner diameter measurement $\phi$ of the press-fitting fastener hole 28 is made smaller than the inner diameter measurement $\phi'$ of the other through-holes 18a; however, the inner diameter measurement $\phi$ of the press-fitting fastener hole 28 may also have an inner diameter measurement made smaller by making a diameter of a bore-hole from a drill or the like when piercing the through-holes 18a in the first printed board 12 smaller than the through-holes 18a, for example. Alternatively, as in the present embodiment, in a case where the press-fitting fastener hole 28 is also used as a through-hole, the diameter of the bore hole is made equal to the through-holes 18a and a thickness measurement of the plating deposited on the inner circumferential surface is made thicker than the through-holes 18a. Thereby, the inner diameter measurement $\phi$ of the press-fitting fastener hole 28 can also be made smaller, or the like, than the inner diameter measurement $\phi'$ of the through-holes 18a. When done in this way, the press-fitting fastener hole 28 can also be bored with the same drill as the through-holes 18a without requiring changing of the drill. In addition, plating thickness is ensured and thus a risk of the plating peeling during press-fitting of the interboard terminal 16 can also be reduced.

Meanwhile, the second printed board 14 is conventionally known, and has a longitudinal rectangular shape larger than the first printed board 12. Though a detailed illustration is omitted, through-holes 18b are respectively pierced in the second printed board 14 in positions corresponding to each of the through-holes 18a, which include the press-fitting fastener hole 28, on the first printed board 12.

Figure 4:
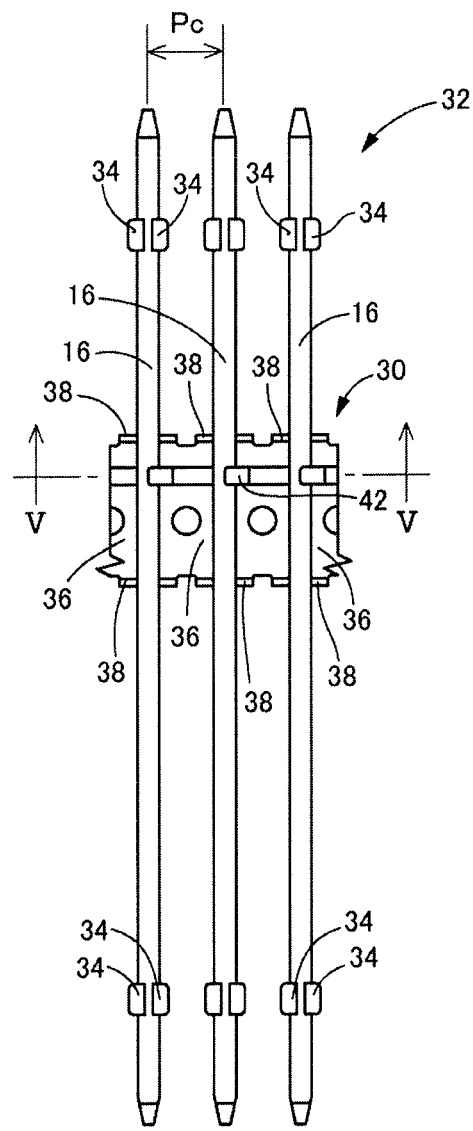
FIG. 4 is a side view illustrating a portion of a chain terminal.

The first printed board 12 and the second printed board 14 are mutually connected by the plurality of interboard terminals 16. A chain terminal 32 is favorably used as the interboard terminals 16, as shown in FIG. 4, in which the plurality of interboard terminals 16 are connected in parallel by a belt-like carrier 30. Each of the interboard terminals 16 has a straight shape formed by a metallic wire rod having a substantially square shape in cross-section and being cut at a predetermined length. A pair of nub-like abutments 34 projecting to both outward sides are formed at both end portions in a length direction of the interboard terminal 16 by crushing or the like.

Figure 5:
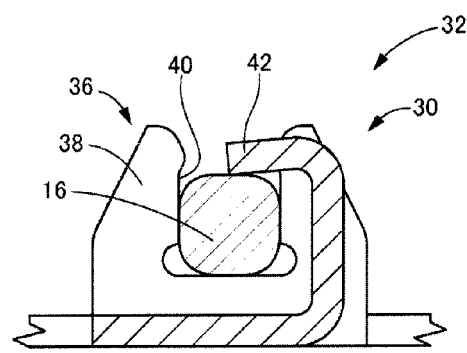
FIG. 5 is an expanded view of a cross-section V-V in FIG. 4.

The plurality of such interboard terminals 16 are connected by the carrier 30 in a parallel state extending in parallel to one another. The carrier 30 is formed from a thin metallic plate and is successively formed with a plurality of unit portions 36. In addition, the carrier 30 is made to be easily severable between each of the unit portions 36. As shown in FIG. 5, latching portions 38 rising up perpendicularly are formed curving at both terminal edges of each unit portion 36. The interboard terminal 16 is made so as to fit into and be held within cutaways 40 formed on the latching portions 38. Further, between the latching portions 38 on each of the unit portions 36, a fastener clip 42 having substantially an L-shape in cross-section is formed by being cut away, and the interboard terminal 16 is fastened and held with the fastener clip 42. Moreover, the fastener clip 42 partially overlaps with the interboard terminal 16 and, by pulling the carrier 30 away downward in FIG. 5, a latched state between the interboard terminal 16 and the fastener clip 42 can be easily released and thus the interboard terminal 16 is made easily separable from the carrier 30. In addition, the chain terminal 32, in which the plurality of interboard terminals 16 are connected in parallel by the carrier 30, is configured by the interboard terminals 16 being held by each of the unit portions 36. Furthermore, in a state connected to the carrier 30, a placement interval Pc for each of the interboard terminals 16 is made to equal a placement interval Pt of the through-holes 18a and 18b, including the press-fitting fastener holes 28, on the first printed board 12 and the second printed board 14 (see FIG. 3).

Figure 6:
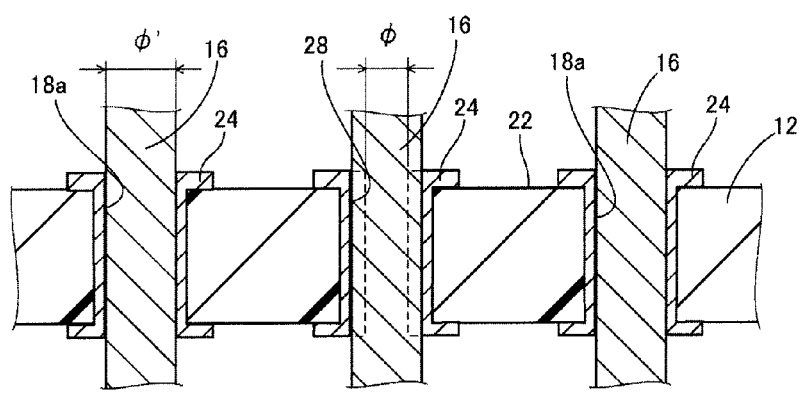
FIG. 6 is an explanatory cross-sectional view for describing an insertion state of interboard terminals through the first printed board.

In addition, in a state connected to the carrier 30, the interboard terminals 16 can be cut away to the same number as the through-holes 18a, including the press-fitting fastener hole 28, in the through-hole lines 20a, 20b, and 20c on the first printed board 12 by the carrier 30 in this type of chain terminal 32 being severed. The first ends of each of the interboard terminals 16 are then inserted through the through-holes 18a, including the press-fitting fastener hole 28, in each of the through-hole lines 20a, 20b, and 20c. Furthermore, the amount of insertion of the interboard terminals 16 into the through-holes 18a is regulated by the abutments 34 touching the first printed board 12. As shown in FIG. 6, the interboard terminal 16 inserted through the press-fitting fastener hole 28 is fastened in a state projecting from the first printed board 12 by being press-fitted into the press-fitting fastener hole 28, without requiring soldering. Furthermore, in the present embodiment, the inner diameter measurement φ of the press-fitting fastener hole 28 is made smaller than the inner diameter measurement φ' of the through-holes 18a by increasing the thickness of the plating on the inner circumferential surface. In addition, the inner diameter measurement φ of the press-fitting fastener hole 28 is made smaller than a maximum outer shape measurement of an axially-perpendicular cross-section at the end portion of the interboard terminal 16 inserted through the press-fitting fastener hole 28. Thereby, the interboard terminal 16 inserted through the press-fitting fastener hole 28 is press-fitted and fastened while scraping away the plating on the inner circumferential surface of the press-fitting fastener hole 28. In addition, the first ends of the other interboard terminals 16 are held in position in a state inserted through each through-hole 18a without requiring any particular press-fitting force due to being connected by the carrier 30 to the interboard terminal 16 press-fitted and fastened to the press-fitting fastener hole 28. Under these conditions, by being reflow soldered in the state inserted through each of the through-holes 18a, including the press-fitting fastener hole 28, each of the interboard terminals 16 is electrically connected to each of the through-holes 18a, including the press-fitting fastener hole 28, and is provided projecting from the first printed board 12.

In addition, due to the overlap of the first printed board 12, on which the interboard terminals 16 are projectingly provided, with the second printed board 14, the second ends of the interboard terminals 16 projecting from the first printed board 12 are inserted through each of the through-holes 18b on the second printed board 14. Furthermore, the amount of insertion of the interboard terminals 16 into the through-holes 18b is regulated by the abutments 34 touching the second printed board 14. Further, on the second printed board 14, a plurality of connector terminals 44, relays 46, and the like connected to fuses, connectors, and the like are inserted through through-holes not shown in the drawings. The end portions of the interboard terminals 16 inserted through the through-holes 18b are flow soldered along with the connector terminals 44 and the relays 46. Thereby, the laminate printed board 10 is configured in which the first printed board 12 and the second printed board 14 are mutually connected by the plurality of interboard terminals 16.

Furthermore, the laminate printed board 10 of this type is favorably manufactured as below, for example. First, the first printed board 12 and the second printed board 14 are prepared. Using a conventionally known procedure, the first printed board 12 is formed with the plurality of through-holes 18a in a line, thereby forming the through-hole lines 20a, 20b, and 20c. Further, as described above, the press-fitting fastener hole 28 is formed within each of the through-hole lines 20a, 20b, and 20c, for example by making the bore-hole diameter of a drill smaller than the through-holes 18a, or by making the thickness measurement of the plating larger than the through-holes 18a. In addition, the chain terminal 32 is prepared and, by severing the carrier 30 in the chain terminal 32, the interboard terminals 16 are prepared by being cut away in a state where connection to the carrier 30 is maintained, to the same number as the through-holes 18a, including the press-fitting fastener hole 28, in the through-hole lines 20a, 20b, and 20c on the first printed board 12.

Figure 7:
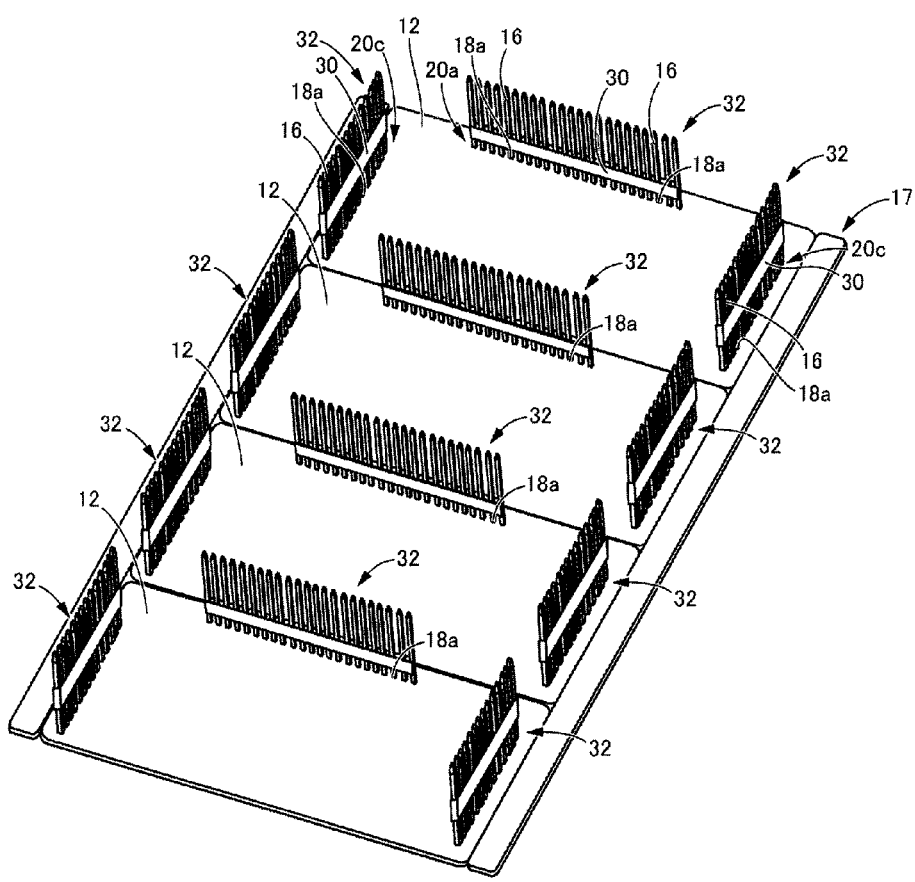
FIG. 7 is an explanatory view for describing a soldering process of the interboard terminals to the first printed board.

Next, as shown in FIG. 7, first ends of each of the interboard terminals 16 are inserted through each of the through-holes 18a, including the press-fitting fastener hole 28, in the through-hole lines 20a, 20b, and 20c on the first printed board 12. Furthermore, although omitted from the drawings, a cream solder in a paste form for reflow soldering is printed on the first printed board 12. Further, surface-mounted components such as an LSI are disposed on the surface 22 of the first printed board 12, as necessary. Moreover, in FIG. 7, by inserting each of the interboard terminals 16 through each of the through-holes 18a on four of the first printed boards 12 prior to cutting away from the board 17, soldering of the interboard terminals 16 to four of the first printed boards 12 is performed simultaneously. During this insertion, the interboard terminal 16 inserted through the press-fitting fastener hole 28 is fastened in a press-fitted state to the press-fitting fastener hole 28. Accordingly, the other interboard terminals 16 are connected by the carrier 30 to the interboard terminal 16 press-fitted and fastened to the press-fitting fastener hole 28 and are held in a state inserted through each of the through-holes 18a. In addition, by dropping the first printed board 12, in which the interboard terminals 16 have been inserted through the through-holes 18a, into a reflow kiln and by melting the solder, each of the interboard terminals 16 is reflow soldered to the first printed board 12, along with the surface-mounted components. As described above, in the present embodiment, reflow soldering of four of the first printed boards 12 is performed simultaneously and, after reflow soldering of the interboard terminals 16 is completed, each of the first printed boards 12 is individually cut away from the board 17.

Next, as shown in FIG. 1, in addition to inserting the connector terminals 44 and the relays 46 through the through-holes (not shown in the drawing) of the second printed board 14, the first printed board 12 obtained previously is overlapped on the second printed board 14, and the second ends of the interboard terminals 16 projecting from the first printed board 12 are respectively inserted through the corresponding through-holes 18b of the second printed board 14. Moreover, in this state, each of the interboard terminals 16 is preferably maintained in a state connected to the carrier 30. Also, by immersing the reverse surface of the second printed board 14 in a soldering pot filled with liquid solder, the interboard terminals 16 are flow soldered to the second printed board 14 along with the connector terminals 44, the relays 46, and the like. Thereafter, by peeling away the carrier 30 connecting the interboard terminals 16, the laminate printed board 10 can be obtained.

According to the laminate printed board 10 having such a configuration, the press-fitting fastener hole 28 capable of press-fitting and fastening the interboard terminal 16 is formed in each of the through-hole lines 20a, 20b, and 20c on the first printed board 12. Thereby, in a state where the plurality of interboard terminals 16 are connected to the carrier 30, by press-fitting and fastening one of the interboard terminals 16 to the press-fitting fastener hole 28, the other interboard terminals 16 can be held via the carrier 30 in a state inserted through each of the through-holes 18a. As a result, the plurality of interboard terminals 16 can be held in a state inserted through the through-holes 18a without requiring a special component such as a base. In addition, the plurality of interboard terminals 16 are reflow soldered to the first printed board 12 in a state inserted through the through-holes 18a. Thereby, as in a case where the interboard terminals 16 are flow soldered to both the first printed board 12 and the second printed board 14, for example, the time and effort of immersing in the soldering pot the reverse surface of the first printed board 12 on which the first ends of the interboard terminals 16 project, and then once again immersing in the soldering pot the reverse surface of the second printed board 14 on which the second ends project becomes unnecessary, and a simplification of the soldering process can be achieved. In particular, in a case where the surface-mounted components are provided on the surface 22 of the first printed board 12, the interboard terminals 16 can be soldered to the first printed board 12 in the reflow soldering process of the surface-mounted components, and further efficiency of the manufacturing process can be achieved.

In particular, in the present embodiment, the land 24 is formed on the press-fitting fastener hole 28, and the interboard terminal 16 press-fitted and fastened to the press-fitting fastener hole 28 is also fastened by soldering to the land 24. Thereby, the interboard terminal 16 can be fastened more securely to the press-fitting fastener hole 28, and the risk can be reduced that the interboard terminal 16 inserted through the press-fitting fastener hole 28 may slip free and become a foreign body with respect to manufacturing apparatuses, and thus impart a negative effect. Further, by connecting the press-fitting fastener hole 28 to the printed wiring 26 as well, the press-fitting fastener hole 28 can also be used as a through-hole configuring an electrically conductive path, and further efficient use of the first printed board 12 can be achieved.

The press-fitting fastener hole 28 is formed in a central portion of each of the through-hole lines 20a, 20b, and 20c. Thereby, by fastening the central portion of the plurality of the interboard terminals 16 connected by the carrier 30 to the press-fitting fastener hole 28, the plurality of interboard terminals 16 on both sides of the interboard terminal 16 fastened to the press-fitting fastener hole 28 can be supported with good balance. Moreover, only one press-fitting fastener hole 28 is formed in each of the through-hole lines 20a, 20b, and 20c. When the plurality of interboard terminals 16 are inserted through the through-holes 18a, only one of the interboard terminals 16 is press-fitted into the press-fitting fastener hole 28, and thus the first printed board 12 can be easily assembled, without requiring an excessive press-fitting force.

An embodiment of the present invention was described above; however, the present invention is not limited to this specific description. For example, a press-fitting fastener hole is not required to be a through-hole configuring a conductive path, and may be a simple through-hole passing through the first printed board. When made in such a way, even where there is a risk of damaging the press-fitting fastener hole during press-fitting of the interboard terminal, there is no need to weigh a reduction in reliability of the electrical connection. Further, the land formed on the press-fitting fastener hole is not strictly required, either. However, the land alone may be formed, without being connected to the printed wiring. When made in such a way, the interboard terminal press-fitted and fastened to the press-fitting fastener hole is soldered to the land and can ensure a stronger fastening force.

Further, the shape of the opening of the press-fitting fastener hole is not limited to a specific shape, so long as the inserted interboard terminal can be press-fitted and fastened thereto. Therefore, in a case where the interboard terminal has a flattened shape in cross-section or the like, for example, the press-fitting fastener hole may have a long hole shape, or the like. Moreover, a plurality of the press-fitting fastener holes may be formed in the through-hole lines, and are not limited necessarily to being formed in the central portion of the through-hole lines. Therefore, for example, two of the press-fitting fastener holes may be formed at both end portions of the through-hole lines, or the like.

It is noted that the foregoing examples have been provided merely for the purpose of explanation and are in no way to be construed as limiting of the present invention. While the present invention has been described with reference to exemplary embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular structures, materials and embodiments, the present invention is not intended to be limited to the particulars disclosed herein; rather, the present invention extends to all functionally equivalent structures, methods and uses, such as are within the scope of the appended claims.

The present invention is not limited to the above described embodiments, and various variations and modifications may be possible without departing from the scope of the present invention.

What is claimed is:

1. A laminate printed board having a first printed board and a second printed board spaced apart, the first printed board and the second printed board being mutually connected by a plurality of interboard terminals, both ends of which are inserted through and soldered to a plurality of through-holes provided on the first and second printed boards, wherein
the plurality of through-holes are formed in a line on the first printed board and at least one press-fitting fastener hole passing through the first printed board is formed within the line of through-holes;
a first end of one of the interboard terminals is press-fitted and fastened to the press-fitting fastener hole, and the first ends of the other interboard terminals are inserted through and soldered to the through-holes on the first printed board; and
second ends of the plurality of interboard terminals are inserted through and soldered to the through-holes on the second printed board.

2. The laminate printed board according to claim 1, wherein a land is formed on a circumferential edge of an opening of the press-fitting fastener hole on a side where the second ends of the interboard terminals project, and the interboard terminal press-fitted into the press-fitting fastener hole is reflow soldered to the land.

3. The laminate printed board according to claim 1, wherein the press-fitting fastener hole is formed in a central portion of the through-hole line on the first printed board.

4. The laminate printed board according to claim 1, wherein the press-fitting fastener hole is one of the plurality of through-holes which are electrically connected to printed wirings on the first printed board.

5. The laminate printed board according to claim 1, wherein the first ends of the interboard terminals are reflow soldered to the through-holes on the first printed board, and the second ends of the interboard terminals are flow soldered to the through-holes on the second printed board.

6. The laminate printed board according to claim 1, wherein a diameter of the at least one press-fitting fastener hole is smaller than a diameter of the through-holes on the first printed board and the second printed board.

7. A manufacturing method of a laminate printed board wherein a first printed board and a second printed board are spaced apart, the first printed board and the second printed board being mutually connected by a plurality of interboard terminals, both ends of which are inserted through and soldered to a plurality of through-holes provided on the first and second printed boards, comprising:
forming the plurality of through-holes in a line on the first printed board;
forming at least one press-fitting fastener hole passing through the first printed board within the line of through-holes on the first printed board;
preparing a chain terminal in which the plurality of interboard terminals are separably connected in parallel by a carrier;
press-fitting and fastening a first end of one interboard terminal in the chain terminal to the press-fitting fastener hole, inserting the first ends of the other interboard terminals connected by the carrier through the through-holes on the first printed board, and soldering the first ends to the first printed board; and
inserting second ends of the plurality of interboard terminals in the chain terminal through the through-holes on the second printed board, and soldering the second ends to the second printed board.

8. The manufacturing method of a laminate printed board according to claim 7, including reflow soldering the first ends of the interboard terminals to the first printed board, and flow soldering the second ends of the interboard terminals to the second printed board.

9. The manufacturing method of a laminate printed board according to claim 7, further comprising providing a diameter of the at least one press-fitting fastener hole to be smaller that a diameter of the through-holes on the first printed board and the second printed board.

* * * * *